United States Patent [19]

Takeda et al.

[11] 4,161,701
[45] Jul. 17, 1979

[54] SEMICONDUCTOR LASER

[75] Inventors: Yutaka Takeda, Ohme; Satoshi Nakamura, Hachioji; Naoki Chinone, Kokubunji; Hisao Nakashima, Tokorozawa; Kazuhiro Kurata, Hachioji, all of Japan

[73] Assignee: Hitachi, Ltd., Tokyo, Japan

[21] Appl. No.: 780,789

[22] Filed: Mar. 24, 1977

[30] Foreign Application Priority Data

Mar. 26, 1976 [JP] Japan ................................. 51-32581

[51] Int. Cl.² ............................................. H01S 3/19
[52] U.S. Cl. ........................ 331/94.5 H; 331/94.5 P; 357/18; 357/56; 357/81
[58] Field of Search ..................... 331/94.5 H, 94.5 P; 357/18, 55, 56, 81

[56] References Cited

U.S. PATENT DOCUMENTS

| | | | |
|---|---|---|---|
| 3,753,053 | 8/1973 | Swartz | 357/81 X |
| 3,896,473 | 7/1975 | DiLorenzo et al. | 357/18 X |
| 3,903,592 | 9/1975 | Heckl | 357/56 X |
| 4,021,839 | 5/1977 | Denlinger | 357/81 X |

*Primary Examiner*—James W. Davie
*Attorney, Agent, or Firm*—Craig and Antonelli

[57] ABSTRACT

A semiconductor layer for supporting a diode chip of a semiconductor laser is formed to be higher than a semiconductor layer containing a current-conducting region, whereby stresses acting on the diode chip by mounting the diode chip are relieved to prevent degradation of performance and reduced life of the semiconductor laser.

6 Claims, 8 Drawing Figures

SEMICONDUCTOR LASER

FIELD OF THE INVENTION

This invention relates to improvements in a semiconductor laser having a structure which avoids reduction of the performance and life of the semiconductor laser resulting from degradation by stresses acting on a diode chip due to the shape thereof upon mounting the semiconductor laser on a heat sink.

DESCRIPTION OF THE PRIOR ART

FIGS. 1a and 1b are vertical sectional views each of which shows the structure of a prior-art, mesa-stripe geometry semiconductor laser. On an N-type GaAs substrate 1, epitaxial layers are successively grown of an N-type $Ga_{1-x}Al_xAs$ ($0<x<1$) layer 2, P-type GaAS layer 3, P-type $Ga_{1-x}Al_xAs$ layer ($0<x<1$) 4 and P-type GaAs layer 5. Further, the surface of the epitaxially grown layers on one or both sides of a central region 11 is selectively etched by photolithography so as to form a groove or grooves. Thus, a mesa-shaped semiconductor for supporting a diode chip 12 (and 12') is formed, which stands adjacent to a mesa-shaped semiconductor containing a current-conducting region 11 and separated by the etched groove. Subsequently, the entire surface of the epitaxially grown layers formed with the mesa-shaped portions is coated with $SiO_2$ 6 as a dielectric layer. Thereafter, in order to conduct an operating current without spreading, the $SiO_2$ layer 6 on the current-conducting mesa 11 has only the central part removed with the shoulder part remaining as illustrated in FIG. 1a or 1b. Thereafter, an electrode 7 and an electrode 8 are respectively formed by vacuum evaporation, the resultant substrate is split into a plurality of elements by cleavage or scribing, and the individual split element (diode chip) is bonded to a heat sink of copper 10 by solder 9. In the prior-art mesa-stripe geometry semiconductor laser described above, the $SiO_2$ layer 6 is left at the shoulder of the mesa 11, and hence, the supporting mesas 12, 12' and the current-conducting mesa 11 have equal heights. In this respect, the following disadvantages occur upon bonding the diode chip to the heat sink 10 by the solder 9.

(a) Since pressure is applied in the bonding to the heat sink, a stress is exerted on the active region of the P-type GaAs layer 3 under the current-conducting mesa 11. (b) When the $SiO_2$ layer 6 remains at the upper shoulder of the current-conducting mesa 11, a stress is exerted by the edge of the $SiO_2$ layer. (c) Due to heating for the soldering, stresses which are caused by respectively different thermal expansions of the heat sink 10, solder 9, electrode 7 and $SiO_2$ film 6 are exerted on the active region of the P-type GaAs 3 as in (a). When the stresses are exerted on the active region of the P-type GaAs layer 3 in this manner, laser oscillation does not occur. Even if the oscillation is possible and no problem is posed as to the performance, the life will become short.

In a planar-type semiconductor laser, the supporting mesa is not provided and a heat sink is mounted on an electrode on a diode chip through solder unlike the case of the mesa-type semiconductor laser. As in the foregoing, therefore, stresses are exerted on an active region, so that the planar-type semiconductor laser is incapable of laser oscillation and becomes short-lived.

SUMMARY OF THE INVENTION

This invention has been made in order to eliminate the disadvantages in the prior-art semiconductor lasers.

This invention is so constructed that a semiconductor layer of a current-conducting portion in a diode chip formed by an etched groove is lower than a supporting mounting semiconductor layer and that no dielectric layer remains on the upper surface of the current-conducting semiconductor layer.

When the semiconductor laser is formed with such construction, there is prevented degradation of laser oscillation performance and reduction of life which are attributed to a stress exerted on the active region of the current-conducting semiconductor layer upon bonding the diode chip to a mount. Moreover, influences on the active region by a stress resulting from etching the dielectric layer remaining on the current-conducting semiconductor layer and a stress resulting from to different coefficients of thermal expansion of the heat sink, solder, an electrode and the dielectric layer at the time of heating for soldering can be obviated, so that an enhancement in the performance of laser oscillation and a long life can be further realized.

DESCRIPTION OF THE PREFERRED EMBODIMENTS

Figure 1A:
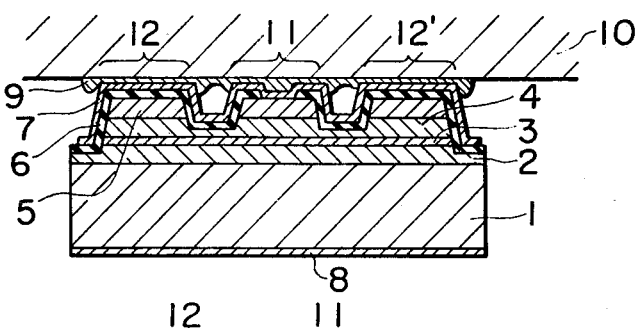
FIGS. 1a and 1b are vertical sectional views each showing the structure of a prior-art semiconductor laser.
Figure 1B:
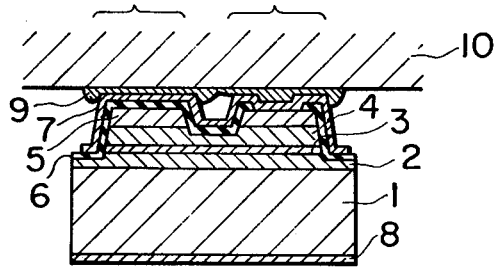
Figure 2A:
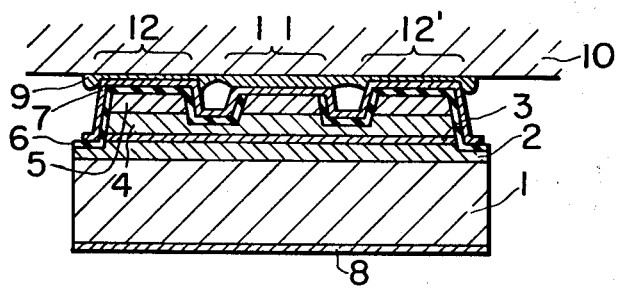
FIGS. 2a and 2b are vertical sectional views each showing the structure of an embodiment of the semiconductor laser of this invention.
Figure 2B:
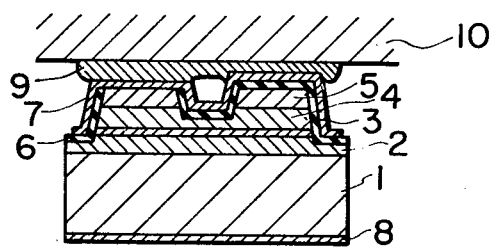

Embodiment 1:

FIGS. 2a and 2b are vertical sectional views of embodiments of this invention both of which are applied to the mesa-stripe geometry semiconductor laser. On an N-type GaAs substrate 1; N-type $Ga_{1-x}Al_xAs$ layer ($0<x<0.3$) 2, P-type GaAs layer 3, P-type $Ga_{1-x}Al_xAs$ layer ($0<x<0.3$) 4 and P-type GaAs layer 5 are successively formed by liquid epitaxial growth. Grooves are formed on both sides of the central part of the grown layers by photolithography, to form supporting mesas 12 and 12' through the grooves (in FIG. 2b, only one supporting mesa is formed with one groove). On the entire surface of the semiconductor wafer formed with the mesas (including a current-conducting mesa 11), an $SiO_2$ film 6 is formed to a thickness of about 5000 Å by chemical vapor deposition (CVD). Subsequently, using photolithography, the $SiO_2$ film 6 is completely removed only at the top part of the current-conducting mesa 11. Thereafter, an electrode 7 and an electrode 8 are respectively formed by vacuum evaporation, the semiconductor wafer is split into chips of 400 $\mu$m×400 $\mu$m, and each chip is bonded to a heat sink 10 with solder 9. In this way, the current-conducting mesa 11 is spaced from the heat sink 10 and becomes lower than the supporting mesas 12 and 12' by about 5000 Å corresponding to the thickness of the $SiO_2$ film 6. In consequence, in bonding the diode chip to the heat sink, stresses are prevented from acting on the active region of the P-type GaAs 3.

Figure 3:
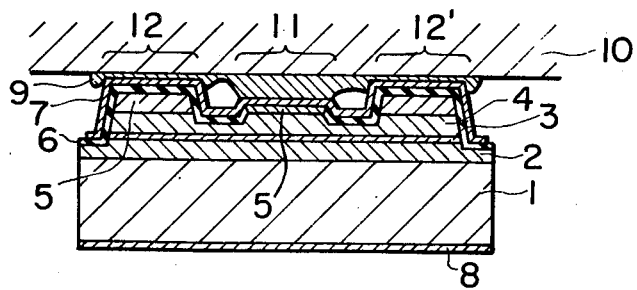
FIG. 3 is a vertical sectional view of another embodiment of the semiconductor laser of this invention.

Embodiment 2:

FIG. 3 is a view of another embodiment of this invention. On an N-type GaAS substrate 1; N-type $Ga_{1-x}Al_xAs$ layer ($0<x<0.3$) 2, P-type GaAs layer 3, P-type $Ga_{1-x}Al_xAs$ layer ($0<x<0.3$) 4 and P-type GaAs layer 5 are successively grown by liquid epitaxial growth. Using photolithography, supporting mesas 12 and 12' and a current-conducting mesa 11 are formed. Subsequently, only the current-conducting mesa 11 is etched with a known etchant containing phosphoric acid by the use of photolithography, to partially or wholly reduce the height of this mesa as shown in FIG. 3. Thereafter, an $SiO_2$ film 6 being about 5000 Å thick is formed on the entire mesa-forming surface by the CVD process, and the $SiO_2$ film 6 is completely removed only at the top surface of the current-conducting mesa 11 by photolithography. Further, an electrode 7 and an electrode 8 are respectively deposited, the substrate is split into diode chips of 400 μm × 400 μm, and each diode chip is bonded to a heat sink 10 with solder 9. In this way, the height of the current-conducting mesa 11 becomes less than the height of the supporting mesas 12, 12' by the sum between about 5000 Å corresponding to the thickness of the $SiO_2$ film 6 and the etched component of the mesa 11.

According to any of the embodiments illustrated in FIGS. 2a, 2b and 3, owing to the fact that the height of the current-conducting mesa 11 is made less than that of the supporting mesas 12, 12' and the fact that the $SiO_2$ film on the top of the current-conducting mesa 11 is completely removed, all the stresses occuring when the chip is set on the heat sink act on the supporting mesas 12, 12', and no stress acts on the current-conducting mesa 11. Besides, since the $SiO_2$ film 6 on the current-conducting mesa 11 is completely removed, the stress has been reduced which occurs on account of the differences of the thermal expansions of the metal, $SiO_2$ and semiconductors at the time of heating for bonding the diode chip to the heat sink with the solder. Thus, the stresses acting on the active layer of the P-type GaAS 3 have been significantly relieved. As the result, the occurrence of dark-line defects and dark-spot defects which arise in the active layer due to the stresses has been lowered, the yield rate of elements capable of oscillation has been enhanced by about 40%, and it has become possible to reliably fabricate the elements having a life longer than 5000 hours. In the embodiment shown in FIG. 3, it is not prefered from the viewpoint of thermal conductivity to excessively increased the etching depth of the crystal forming the current-conducting mesa. It has been experimentally verified that, when the etching depth is increased to beyond a certain extent, the solder coagulates, a clearance is formed between the heat sink and the current-conducting mesa, and the thermal conductivity is degraded. The absence of the contact between the solder on the heat sink and the current-conducting mesa is demeritorious from the point of thermal conductivity, but it is meritorious from the point of stresses acting in the element because no pressure is applied to the laser active region upon bonding the semiconductor laser chip to the heat sink. In some cases, therefore, such expedient is of useful value. Although the supporting mesa is disposed on only one side of the active region defining mesa in the embodiment of FIG. 2b and the pair of supporting mesas are disposed on both the sides of the active region defining mesa in the embodiments of FIGS. 2a and 3, the number of supporting mesas may be further increased, and the arrangement of the supporting mesas can be provided as desired. Further, although the foregoing embodiments exemplify the semiconductor lasers of the GaAS-GaAlAs system, a very small amount of Al can be contained in the GaAs active layer as is known. This invention is also applicable to the mesa-type semiconductor laser employing any other semiconductor material.

Figure 4:
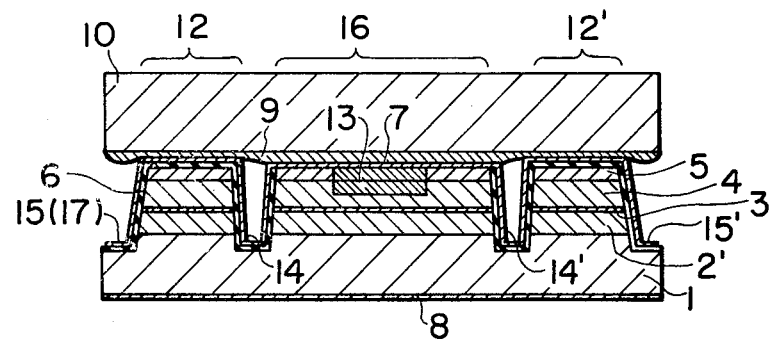
FIGS. 4, 5 and 6 are vertical sectional views each showing the structure of a further embodiment of the semiconductor laser of this invention.

Embodiment 3:

FIG. 4 shows an embodiment in the case of a diffusion type planar semiconductor laser in which a current path is formed by employing diffusion.

After cleaning the surface of an N-type GaAs substrate 1 by etching, Sn-doped N-type $Ga_{1-x}A_xAs$ layer ($x \sim 0.3$) 2', P-type GaAs layer 3, Ge-doped P-type $Ga_{1-x}Al_xAs$ layer ($x \sim 0.3$) 4 and Sn-doped N-type GaAS layer 5 are epitaxially grown on the substrate in the order mentioned. Subsequently, an oxide film (of $SiO_2$ or $Al_2O_3$) is formed on the resultant wafer by the CVD process. Using photolithography, the oxide film is partially removed to form a diffusion window. The diffusion of Zn is carried out at 700° C. for 15 minutes, to form a diffused region 13. Subsequently, grooves or defects 14, 14', 15 and 15' are formed by photolithography and etching. Subsequently, an oxide film (of $SiO_2$ or $Al_2O_3$) 6 is formed by the CVD process on the surfaces of supporting mesas 12, 12' (100 μm wide and 5 μm high) and a region constructing a planar semiconductor laser, 16 (300 μm wide and 5 μm high), the supporting mesas and the region having been formed through etching grooves and defects. Using photolithography, the oxide film is removed only at the top of the region forming the planar semiconductor laser 16. The top surface with the oxide film removed therefrom is somewhat (1–5 μm) etched, and Cr-Au 7 as a P-type electrode is formed on the surface by vacuum evaporation. The electrode material deposited on any other place is removed by etching. The GaAs substrate 1 has the lower surface polished and etched into a total thickness of 100–150 μm, and Au-Ge-Ni 8 is formed as an N-type electrode by the vacuum evaporation.

The semiconductor laser wafer thus formed is cleaned along the defects 15, 15' and in a direction orthogonal thereto to be split into chips of 600 μm × 400 μm. The chip is bonded to a heat sink 10 with solder 9. At this time, the planar type semiconductor laser region 16 is lower than the supporting mesas 12, 12' by the amount removed by etching (1–5 μm) and the thickness of the oxide film formed on the supporting mesas 12, 12'. Therefore, the pressure at the bonding of the chip to the heat sink is fully applied to only the supporting mesas 12, 12'. As the result, no stress acts on the planar type semiconductor laser region 16, and it has become possible to obtain the elements of long life reliably.

Figure 5:
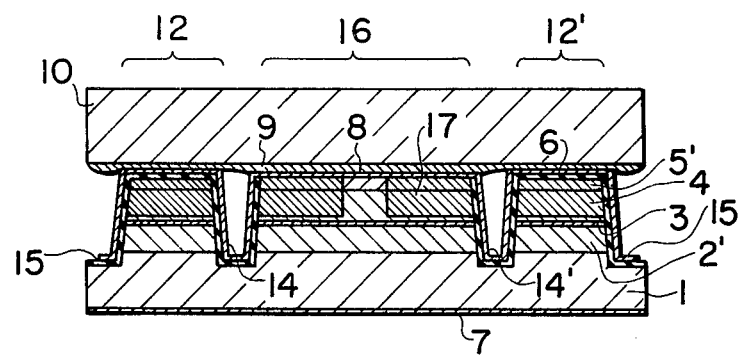

Embodiment 4:

FIG. 5 shows an embodiment in the case of an ion implantation type semiconductor laser in which a portion other than a current path is put into a high-resistance region by the ion implantation.

The epitaxial growth on a GaAs substrate 1 is carried out as in Embodiment 3 with the exception that the last grown layer is changed to Ge-doped P-type GaAs layer 5'. Au (2–3 μm) is formed on this epitaxial grown layer as a protective film at the implantation of protons, and a high-resistance region 17 is formed by the known proton implantation. As described in Embodiment 3, the epitaxially grown layers are formed with grooves and defects 14, 14' and 15, 15' so as to form supporting mesas 12, 12' and a planar type semiconductor laser region 16. As explained in Embodiment 3, the top of the planar type semiconductor laser region 16 is somewhat (1-5 μm) removed by etching, and a P-type electrode 8 is formed by the vacuum evaporation and an oxide film by the CVD process. The crystal is split into chips of 600 μm×400 μm, and the chip is bonded to a heat sink with solder 9. At this time, as in Embodiment 3, the height of the planar semiconductor laser region 16 is less than that of the supporting mesas 12, 12'. Consequently, no stress has come to act on the planar type semiconductor laser region 16, and it has become possible to obtain elements of long life reliably.

Figure 6:
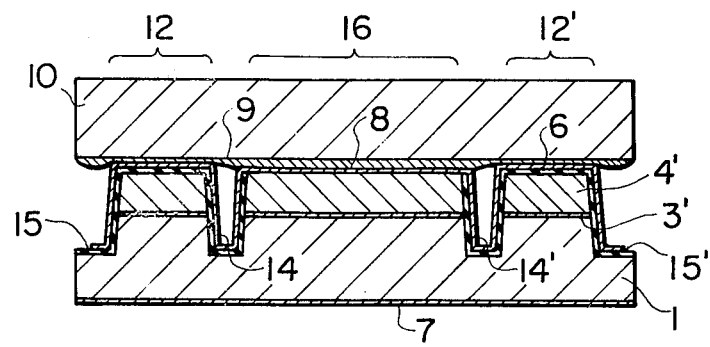

Embodiment 5:

FIG. 6 shows an embodiment in the case of the planar type semiconductor laser of an InP-GaInAsP-InP system. On an N-type InP substrate 1; $Ga_xIn_{1-x}As_yP_{1-y}$ (x=0.12, y=0.23) layer 3, and P-type InP layer 4' are successively grown epitaxially. The crystal grown wafer is treated by the same method as stated in Embodiment 3, and the chip is soldered to a heat sink 10. As the result, as in Embodiment 3, no stress acts on a planar type semiconductor laser region 16, and the effect of rendering the life of the element longer has been achieved.

We claim:

1. A semiconductor laser comprising:
a semiconductor wafer having first and second principal surfaces, a first electrode provided at said first principal surface, a P-N junction formed with an active region at said second principal surface, a current conducting semiconductor region formed on said active region, at least one second semiconductor region formed into a mesa shape on said active region and separated from said current conducting semiconductor region by a groove, a dielectric layer covering said second semiconductor region and said groove, a second electrode formed on said dielectric layer and said current conducting semiconductor region, and a heat sink mounted at said second electrode and being supported by said second semiconductor region and dielectric layer thereon forming a mounting support which is closer to said heat sink than said current conducting semiconductor region.

2. A semiconductor laser according to claim 1, wherein said current conducting semiconductor region is spaced from said heat sink by at least the thickness of said dielectric layer covering said second semiconductor region.

3. A mesa-stripe geometry semiconductor laser comprising:
a semiconductor wafer having first and second principal surfaces, a first electrode provided at said first principal surface, a P-N junction formed with an active region at said second principal surface, a mesa-shaped current conducting semiconductor region formed on at least a part of said active region, at least one support mounting second semiconductor region formed into a mesa shape and separated from said current conducting semiconductor region by a groove, a dielectric layer covering said support mounting second semiconductor region and said groove, a second electrode formed on said dielectric layer and said current conducting semiconductor region, and a heat sink mounted at said second electrode and being supported by said support mounting semiconductor region and dielectric layer thereon forming a mounting support which is closer to said heat sink than said current conducting semiconductor region.

4. A mesa-stripe geometry semiconductor laser according to claim 3, wherein said current conducting semiconductor region is spaced from said heat sink by at least the thickness of said dielectric layer covering said second semiconductor region.

5. A planar-type semiconductor laser comprising:
a semiconductor wafer having first and second principal surfaces, a first electrode provided at said first principal surface, a P-N junction formed with an active region at said second principal surface, a planar current conducting semiconductor region formed on said active region, at least one support mounting second semiconductor region formed into a mesa shape and separated from said current conducting semiconductor region by a groove, a dielectric layer covering said support mounting second semiconductor region and said groove, a second electrode formed on said dielectric layer and said planar current conducting semiconductor region, and a heat sink mounted at said second electrode and being supported by said support mounting semiconductor region and dielectric region thereon forming a mounting support which is closer to said heat sink than said planar current conducting semiconductor region.

6. A planar-type semiconductor laser according to claim 5, wherein said planar current conducting semiconductor region is spaced from said heat sink by at least the thickness of said dielectric layer covering said support mounting second semiconductor region.

* * * * *